(12) United States Patent
Holopainen

(10) Patent No.: US 12,336,063 B2
(45) Date of Patent: Jun. 17, 2025

(54) INORGANIC TFEL DISPLAY ELEMENT AND MANUFACTURING METHOD

(71) Applicant: Lumineq Oy, Espoo (FI)

(72) Inventor: Jani Holopainen, Espoo (FI)

(73) Assignee: LUMINEQ OY, Espoo (FI)

( * ) Notice: Subject to any disclaimer, the term of this patent is extended or adjusted under 35 U.S.C. 154(b) by 12 days.

(21) Appl. No.: 18/686,173

(22) PCT Filed: Aug. 23, 2022

(86) PCT No.: PCT/FI2022/050542
§ 371 (c)(1),
(2) Date: Feb. 23, 2024

(87) PCT Pub. No.: WO2023/025986
PCT Pub. Date: Mar. 2, 2023

(65) Prior Publication Data
US 2024/0357717 A1 Oct. 24, 2024

(30) Foreign Application Priority Data

Aug. 24, 2021 (FI) ...................................... 20215883

(51) Int. Cl.
*H05B 33/02* (2006.01)
*H05B 33/10* (2006.01)

(52) U.S. Cl.
CPC ............. *H05B 33/02* (2013.01); *H05B 33/10* (2013.01)

(58) Field of Classification Search
CPC ........ H05B 33/02; H05B 33/10; H05B 33/14; H05B 33/22; H05B 33/24
See application file for complete search history.

(56) References Cited

U.S. PATENT DOCUMENTS 6,113,977 A 9/2000 Soininen et al.
6,358,632 B1 * 3/2002 Dickey ................... H05B 33/22
428/917

(Continued)

FOREIGN PATENT DOCUMENTS

WO 2007099883 A1 9/2007
WO 2014009601 A1 1/2014
(Continued)

OTHER PUBLICATIONS

Tsakonas Costas et al: "Transparent and 1,2,6-8, Flexible Thin Film Electroluminescent 10,11 Devices Using HiTUS Deposition and Laser Processing Fabrication", IEEE Journal of the Electron Devices Society, IEEE, USA, vol. 4, No. 1, Nov. 2, 2015 (Nov. 2, 2015), pp. 22-29, XP011594830, DOI:10.1109/JEDS.2015.2497086 [retrieved on Dec. 18, 2015] y figure 7a 2-5, 9, Introduction 12-14 p. 25, right-hand col. paragraph 1.

(Continued)

*Primary Examiner* — Erin Kryukova
(74) *Attorney, Agent, or Firm* — Christopher R. Carroll; The Small Patent Law Group LLC

(57) ABSTRACT

An inorganic thin film electroluminescent display element having a layer structure comprising: a first dielectric layer, a luminescent layer, comprising a luminescent material, on the first dielectric layer, and a second dielectric layer on the luminescent layer. Each of the first and the second dielectric layers comprises nanolaminate with alternating aluminum oxide $Al_2O_3$ and hafnium oxide $HfO_2$ sub-layers, the nanolaminate having at least two sub-layers of both types and a thickness of less than or equal to 300 nm.

13 Claims, 2 Drawing Sheets

(not in scale)

(56) References Cited

U.S. PATENT DOCUMENTS

| | | | |
|---|---|---|---|
| 7,258,745 B2* | 8/2007 | Hu | H01L 21/02282 |
| | | | 117/925 |
| 11,464,087 B2* | 10/2022 | Seppänen | C23C 14/542 |
| 2004/0023461 A1* | 2/2004 | Ahn | H01L 21/28194 |
| | | | 438/785 |
| 2004/0033661 A1* | 2/2004 | Yeo | H01L 21/31645 |
| | | | 257/E21.274 |
| 2007/0024189 A1* | 2/2007 | Yamamoto | H05B 33/22 |
| | | | 313/506 |
| 2007/0205428 A1* | 9/2007 | Katayama | C09K 11/02 |
| | | | 257/103 |
| 2012/0245658 A1* | 9/2012 | Pan | A61P 25/00 |
| | | | 564/8 |
| 2019/0223268 A1* | 7/2019 | Seppänen | C23C 16/45531 |

FOREIGN PATENT DOCUMENTS

| | | | | |
|---|---|---|---|---|
| WO | 2018042079 A1 | 3/2018 | | |
| WO | WO-2021133774 A1 * | 7/2021 | | C23C 16/0272 |

OTHER PUBLICATIONS

Krasnov An Ed—Radamson Henry et al: "Selection of dielectrics for alternating-current thin-film electroluminescent device", Thin Solid Films, Elsevier, Amsterdam, NL, vol. 347, No. 1-2, Jun. 22, 1999 (Jun. 22, 1999), pp. 1-13, XP004363571, ISSN: 0040-6090, DOI: 10.1016/S0040-6090(98)01763-5 paragraph [03.1]; figure 1; tables 1,2.
Search report of the priority 20215883 mailed Apr. 21, 2022 (1 page).
International Search Report for PCT/FI2022/050542 mailed Nov. 25, 2022 (5 pages).
Yoshimasa A. Ono, "Electroluminescent Displays", World Scientific Publishing Co., 1995 (ISBN 981-02-1920-0) in Chapters 3,5 and 8.

* cited by examiner

```
┌─────────────────────────────────────────────┐
│ Forming a first dielectric layer comprising │
│ Al2O3/HfO2 nanolaminate by ALD              │
└─────────────────────────────────────────────┘
                      │          ╲___ 11
                      ▼
┌─────────────────────────────────────────────┐
│ Forming a luminescent layer by ALD, with    │
│ maximum processing temperature less than or │
│ equal to 300 C                              │
└─────────────────────────────────────────────┘
                      │          ╲___ 12
                      ▼
┌─────────────────────────────────────────────┐
│ Forming a second dielectric layer comprising│
│ Al2O3/HfO2 nanolaminate by ALD              │
└─────────────────────────────────────────────┘
                                   ╲___ 13
```

Fig. 1

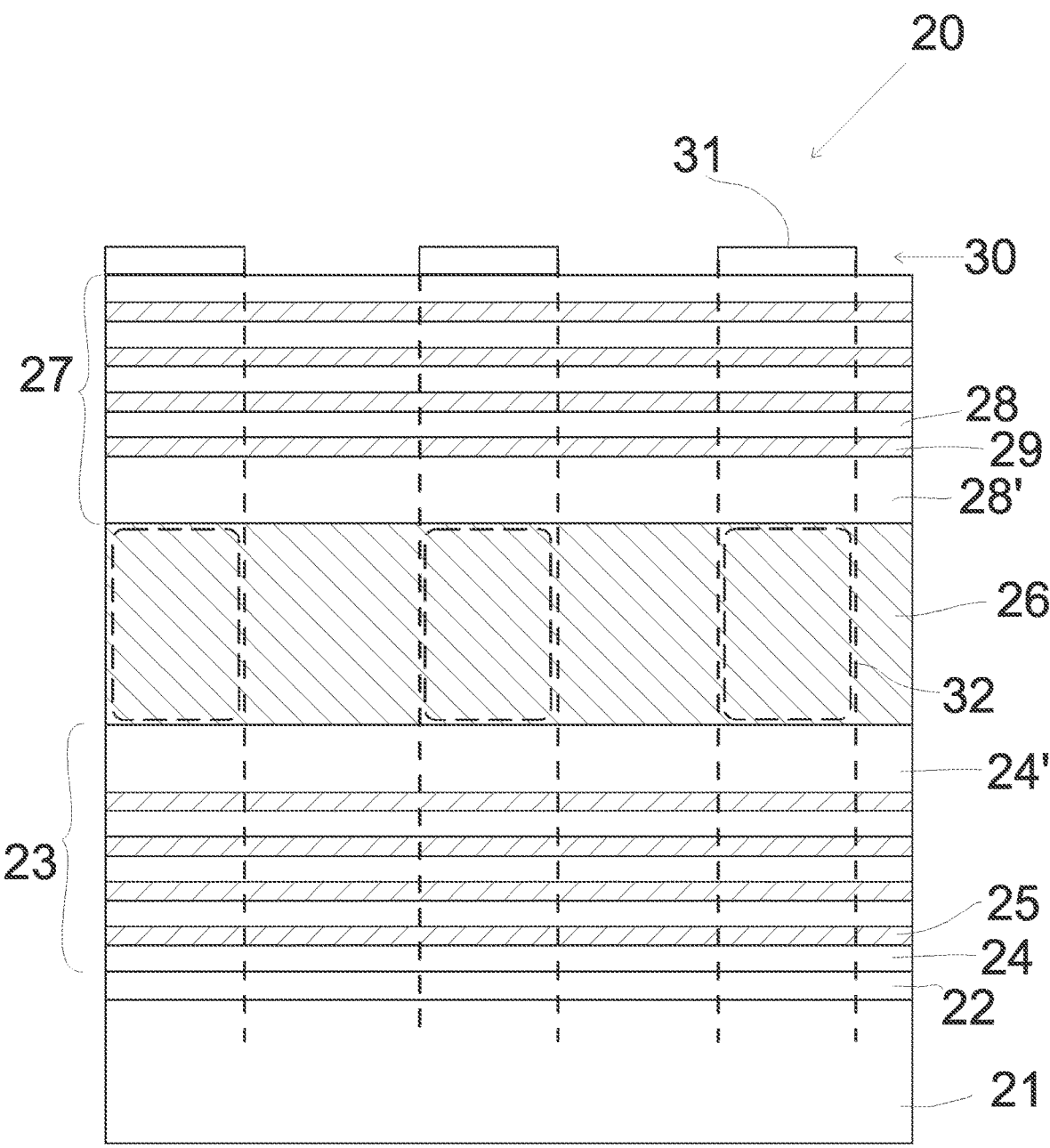
Fig. 2 (not in scale)

INORGANIC TFEL DISPLAY ELEMENT AND MANUFACTURING METHOD

CROSS-REFERENCE TO RELATED APPLICATIONS

This application is a national stage entry of International Patent Application No. PCT/FI2022/050542 (filed 23 Aug. 2022), which claims priority to Finnish Patent Application No. 20215883 (filed 24 Aug. 2021), the entire disclosures of which are incorporated herein by reference.

TECHNICAL FIELD

The present specification relates to electroluminescent displays, especially to inorganic thin film electroluminescent displays.

BACKGROUND

Electroluminescent displays (below also "EL display") have specific properties, such as durability and capacity of functioning at low temperatures, which make them as an excellent display technology for the most challenging operating environments and conditions.

Basically, the operation of an EL display is based on a luminescent material that emits light when exposed to an external electric field.

In inorganic EL displays provided as thin film structures, the luminescent material is arranged as a thin luminescent layer generally having a thickness of less than 1000 nanometers, typically approximately 500-750 nanometers. For low voltage applications, the thickness may be also lower. The luminescent layer is provided between two conductive electrode layers that are electrically insulated from the luminescent layer with thin dielectric layers serving for electrical insulating. A voltage difference between the electrodes provides an electric field, by the effect of which the electrons move in the luminescent layer and some of them excite, in the luminescent layer, so-called luminescent centers which are formed by the doping material(s) of the luminescent layer. Light is emitted as the excitation of the luminescent centers is relaxed.

The basic technology of EL displays is generally known and has been described extensively e.g. in "Electroluminescent Displays" (Yoshimasa A. Ono, World Scientific Publishing Co., 1995 (ISBN 981-02-1920-0) in Chapters 3, 5 and 8.

An EL display element is conventionally manufactured by forming the core operating layers, namely, the dielectric layers, the luminescent layer, and the electrode layers, on a glass substrate having a thickness in the range of 1 mm. Some applications may require thinner substrates. For example, in applications where an EL display element is to be laminated within a glass panel for automotive windscreen, there is only a narrow gap which may have a thickness of some hundreds of micrometers available for the entire stack of the EL display, including the glass substrate thereof.

Substrates with lower thickness may also be useful in applications where an EL display element is to be laminated on a curved, i.e. non-planar external substrate, or in applications of flexible display structure.

In some applications, instead of glass, plastic substrates may be desired to be used.

Various film deposition processes may be used for manufacturing the layer stack of an EL display. One preferred technology is atomic layer deposition ALD enabling well controlled deposition of high-quality films.

One factor affecting the feasibility of ALD and other deposition processes is the processing temperature. Plastic substrates as well as thinner glass substrates may limit the maximum processing temperature lower than the temperatures used in the conventional processes.

From production efficiency point of view, suitability of the deposition processes for batch production may also be desirable. Batch production may require, for example, the precursors of the materials to be deposited to enable in the deposition atmosphere a vapor pressure which is not achievable by conventional sources.

Improved solutions are thereby needed.

SUMMARY

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one aspect, an inorganic, possibly AC (alternating current) drivable, thin film electroluminescent display element is disclosed, the display element having a layer structure comprising a first dielectric layer, a luminescent layer, comprising a luminescent material, on the first dielectric layer, and a second dielectric layer on the luminescent layer.

Each of the first and the second dielectric layers comprises nanolaminate with alternating aluminum oxide $Al_2O_3$ and hafnium oxide $HfO_2$ sub-layers, the nanolaminate having at least two sub-layers of both types.

In a second aspect, a method is disclosed which may be used for manufacturing an electroluminescent display element of the first aspect.

BRIEF DESCRIPTION OF THE DRAWINGS

The present description will be better understood from the following detailed description read in light of the accompanying drawings, wherein:

FIG. 1 illustrates a flow chart of a method for manufacturing an electroluminescent display element; and FIG. 2 illustrates an electroluminescent display element. The drawing of FIG. 2 is not in scale.

DETAILED DESCRIPTION

The method of FIG. 1 may be used for manufacturing an inorganic thin film electroluminescent display element.

A "display element" refers to a structure for a display. A display element may be a complete, operable, stand-alone display device. Alternatively, the "element" may refer to a modular or inseparably integrated element as a part of a complete display device or display unit.

"Inorganic" refers to inorganic type of materials of the display element.

"Thin film" refers to the total thickness of the operational thin film layers of the EL display element, i.e. the layer stack without the transparent substrate thereof, being less than some tens of micrometres. The total thickness may be, for example, in the range of 1 to 10 μm. Typically, it is less than or equal to 3 μm.

Generally, a complete inorganic thin film electroluminescence/electroluminescent ("EL") display element manufactured utilizing the method of FIG. 1 may comprise a dielectric layer-luminescent layer-dielectric layer sub-structure positioned between first and second conductive electrode layers. The entire layer stack may be formed and lie on a transparent substrate formed of glass or plastic or some other suitable material. In operation, with suitable electric field provided in the luminescent layer by supplying a voltage difference between the conductive electrode layers, electrons are discharged into the luminescent layer, giving rise to light emission as luminescence centers excited by the electrons return to their ground state.

The method of FIG. 1 comprises, in operation 11, forming a first dielectric layer which comprises nanolaminate material with alternating aluminum oxide $Al_2O_3$ and hafnium oxide $HfO_2$ sub-layers, the nanolaminate having at least two sublayers of both materials. Thus, the nanolaminate has at least two sub-layers of aluminum oxide, and two sub-layers of hafnium oxide.

Such alternating layers may be considered forming pairs of the two sub-layers of different materials. The nanolaminate may comprise any appropriate number of such pairs of two adjacent sub-layers of different materials, for example, 5 to 25 pairs. In an embodiment, the nanolaminate may comprise at least ten pairs of sub-layers, each $HfO_2$ sub-layer having a thickness of 0.5 to 3 nm.

The prefix "nano" in the term "nanolaminate" refers to the thickness of the alternating sub-layers lying in nanometer scale. The nanolaminate may have a total thickness of less than 300 nm. For example, the total thickness of the nanolaminate may lie in the range some dozens of nanometers. It may be advantageous to have the total thickness of the nanolaminate higher than or equal to 50 nm.

One or more, possibly most or all $HfO_2$ sub-layers may have a thickness in the range of 1 to 10 nanometers, preferably in the range of 1 to 3 nm, for example, about 2 nm. By not forming the sub-layers too thick may enable preventing $HfO_2$ crystallization, as $HfO_2$ tends to crystallize as the layer thickness increases. Amorphous nanolaminate is found to be better than crystalline from the leakage current and light transmission points of view. In addition, already mere division of the dielectric material as such may improve the leakage current performance and thereby the reliability of the dielectric material.

The nanolaminate of at least one of the dielectric layers may comprise at least ten $HfO_2$ sub-layers, each having a thickness in the range of 0.5 to 3 nm. This may be enable keeping individual $HfO_2$ sub-layers sufficiently low to avoid crystallization thereof, but however having the overall thickness of the dielectric layer sufficiently high.

One or more, possibly most or all $Al_2O_3$ sub-layers may have a thickness in the range of 1 to 10 nm, preferably in the range of 1 to 3, for example, about 6 nm.

The sub-layer thickness above may contribute to form a dielectric layer with good electrical properties.

In addition to the paired sub-layers of the nanolaminate, a dielectric layer may also have one or more additional aluminum oxide and/or hafnium oxide sub-layers. Then, the entire dielectric layer may have an even or odd total number of sub-layers. Such additional layer(s) may have thickness (es) different from the sub-layers of the actual nanolaminate part of the dielectric layer.

A dielectric layer may have a sub-layer of aluminum oxide as the sub-layer adjacent to the luminescent layer. Such sub-layer may be part of the nanolaminate or an additional sub-layer. In the latter case, it may have thickness higher than the aluminum oxide sub-layers of the nanolaminate. This may result in higher brightness of the EL display element.

In the example of FIG. 1, the first dielectric layer is formed in operation 11 by atomic layer deposition ALD. A maximum processing temperature of 150 to 350° C., for example, about 250° C., may be used.

"Atomic layer deposition ALD" refers to a thin film technology enabling accurate and well-controlled production of thin film coatings with nanometer-scaled thicknesses. ALD may also be called Atomic Layer Epitaxy ALE. In an ALD process, the deposition surface is alternately exposed to at least two precursors, one precursor at a time, to form on the deposition surface a coating by alternately repeating essentially self-limiting surface reactions between the deposition surface and the precursors. As a result, the deposited material is "grown" molecule layer by molecule layer.

The accuracy of ALD in the dielectric layer formation may result in high electrical performance of the device.

"Maximum processing temperature" of the ALD process refers to both the maximum temperature in the ALD reactor chamber as well as the maximum temperatures of the precursors and any carrier gases supplied therein. Thus, neither the temperature of the reactor chamber nor the temperature of any gas supplied therein may exceed the maximum temperature.

Preferably, tris(dimethylamino)cyclopentadienylhafnium $CpHf(NMe_2)_3$ is used as the precursor for hafnium in the ALD process.

Tris(dimethylamino)cyclopentadienylhafnium $CpHf(NMe_2)_3$ is commercially provided by Air Liquide with a trade name HyALD™. HyALD™ is a liquid-form precursor enabling achieving sufficiently high vapor pressure of the deposition atmosphere for efficient batch processing of a large amount of EL display elements at the same time.

Other precursors in the ALD process may be, for example, trimethylaluminum TMA for aluminum and water $H_2O$ or ozone $O_3$ for oxygen.

In other embodiments, any other appropriate deposition method and precursors may be used. Preferably, the maximum processing temperature is also then limited to the range specified above.

Next, in operation 12, a luminescent layer comprising a luminescent material is formed on the first dielectric layer.

The luminescent layer comprising a luminescent material may refer to the luminescent layer entirely consisting of the luminescent material. Alternatively, there may be one or more other materials also present in the luminescent layer.

It the example of FIG. 1, the luminescent layer is deposited by atomic layer deposition ALD with a maximum process temperature in the range of 125 to 300° C., preferably 175 to 250° C. or 200 to 225° C., for example, 210° C.

The luminescent material may be, for example, manganese doped zinc sulfide ZnS:Mn or terbium-doped zinc sulfide ZnS:Tb.

Known precursors may be used to deposit the luminescent material. For example, in the case of ZnS:Mn, diethylzinc DEZ, hydrogen sulfide $H_2S$, and $Mn(thd)_3$ may be used as precursors. Other possible Mn precursors are $Mn(C_5H_5)_2$ and its alkyl-, aryl- or carbonyl-substituted derivatives.

As discussed above, the "luminescent layer" serves as a core part of the completed electroluminescent display element, emitting light when exposed to suitable electric field. This layer and/or the light emitting material thereof may also be called "phosphor".

Depositing a layer "on" a substrate or on a previously deposited layer does not necessitate the deposition taking place "directly" on the substrate or on the previously deposited layer, but one or more intermediate layers may be formed therebetween. Correspondingly, a layer or a layer structure lying "on" another layer or substrate does not necessarily lie "directly" on that another layer or substrate. For example, a layer structure of a dielectric layer, a luminescent layer, and a dielectric layer lying on a transparent substrate does not exclude the possibility of a conductive electrode layer lying between the substrate and said layer structure.

In conventional ALD processes for depositing luminescent materials such as ZnS:Mn, relatively high temperatures are used. For example, maximum processing temperatures in the range of 500-530° C. are typically used. Some examples of depositing a ZnS:Mn luminescent layer in an EL display with ATO dielectric layers using diethylzinc DEZ, hydrogen sulfide H2S, and Mn(thd)$_3$ as precursors is discussed in U.S. Pat. No. 6,113,977 A. In those examples, process temperatures of 350 and 450° C. were used.

The inventors have now surprisingly found, in contrast to the established understanding in the art, that with $Al_2O_3$/$HfO_2$ nanolaminate in the dielectric layers, high quality and stable luminescent layer of an EL display element may be produced in as low temperatures as 300° C. and lower. As the dielectric layers may be formed using maximum processing temperatures such as 150 to 350° C., for example, about 250° C., using such low maximum processing temperatures for the luminescent layer may provide great advantages. Namely, then the entire process of forming the dielectric layers and the luminescent layer may take place in temperatures, for example, not substantially exceeding 300° C.

This may enable forming the EL display element layers on very thin glass substrates having thicknesses, for example, in the range of 100-400 μm or even lower without the risk that the glass substrate would lose its rigidity in result of softening. The latter is of particular importance when taking into account that in typical manufacturing processes, the glass sheets are conveyed automatically and, to save floor space of the manufacture, the glasses are held and transferred vertically or almost vertically, e.g. at 80 degrees angle relative to horizon. Then, if the glass sheets become so thin that they start bending under their own weight, the conveying process becomes considerably more difficult. Further, in higher temperatures, the very thin sheets may deform from a uniform and flat shape to an unwanted wrinkled or crumpled shape if they are not completely evenly supported, even when held horizontally, let alone in vertical or semi-vertical position.

Such thin substrates facilitate producing the entire EL display element so as to have a total thickness clearly below that of the conventional EL displays. This may enable, for example, manufacturing of EL display elements with a total thickness allowing laminating the EL display within a glass panel for automotive wind screen. A typical laminated wind screen assembly comprises a glass plate with a thickness of 2.5 mm, an interlayer of a binder, such as Polyvinyl butyral (PVB), and another glass plate of 2.5 mm. Typical standard thicknesses for the binder layer are 0.38 mm, 0.76 mm, and 1.14 mm. Such assemblies may be referred to, according to the overall thickness thereof, for example, as "5.38 laminated glass". With this kind of glass assembly, the transparent EL display shall have a thickness of less than 0.38/0.76/1.14 mm, taking into account that usually a binder layer of 10 μm or somewhat less is needed at least on one side of the EL display to attach the display to the assembly.

Further, with such low glass substrates, the EL display element may be formed so as to be flexible allowing, for example, laminating thereof on curved and/or flexible external substrates.

In addition, the low maximum processing temperatures may enable forming the EL display element layers even on plastic substrates.

In operation 13, a second dielectric layer comprising nanolaminate material with alternating aluminum oxide $Al_2O_3$ and hafnium oxide $HfO_2$ sub-layers is formed on the on the luminescent layer. The second dielectric layer may be formed similarly to the first dielectric layer discussed above.

In FIG. 1, manufacturing of only the dielectric layers and the luminescent layer is illustrated. Complete manufacturing process may further comprise, for example, forming a first conductive electrode layer on the transparent substrate, and forming a second conductive electrode layer on the second dielectric layer. In addition to any appropriate additional layers, for example, for protective and/or passivating purposes may be formed. In such operations, principles and processes as such known in the art may be used.

The EL display element manufactured in the method of FIG. 1 may be a segment type display element or a matrix type display element. The first and the second conductive electrode layers may be patterned in accordance with the type of the display element.

For example, in the case of a matrix-type display element, the first and the second conductive electrode layers may be patterned to form rows and columns, whereby pixels are formed at the sites where the rows and the columns of the different electrode layers intersect. As a voltage is applied between such intersecting electrodes, electroluminescence appears in the phosphor layer at the relevant pixel. In the case of a segment-type display element, the active areas, i.e. the light emitting areas of the display can be formed by patterning the first and the second conductive electrode layers in accordance with the desired light emitting segment arrangement. Thereby, for example, 7-segment number displays or designs displaying discrete icons or symbols at predetermined locations may be implemented.

The EL display element 20 of FIG. 2 may be manufactured generally in accordance with any of the embodiments of the method discussed above with reference to FIG. 1. What is stated above about the EL display manufactured by the method discussed with reference to FIG. 1 applies, mutatis mutandis, also to the EL display element 20 of FIG. 2. The same applies vice versa: What is stated below about the manufacturing method of the EL display discussed with reference to FIG. 2 applies, mutatis mutandis, also to the manufacturing method of FIG. 2.

The EL display element 20 comprises, and the layers thereof are formed on a glass substrate 21 which may have a thickness, for example, in the range of 100 to 500 μm, for example, about 400 μm. It is possible to use even as low glass substrate thicknesses as less than or equal to 100 μm. In other embodiments, thicker glass substrates may be used.

The glass substrate may be formed of, for example, soda lime glass, borosilicate glass, or any other glass material with sufficient transparency. In some embodiments, substrates formed of other materials may be used, such as plastic or polymer substrates which may provide greater mechanical durability or flexibility than glass.

A first or lower conductive electrode layer 22 is formed as an array of conductor stripes on the glass substrate. The conductive electrode layer may be first deposited, for example, by ALD, and then patterned accordance with the desired patterning by means of any appropriate lithographic operations.

A first or lower dielectric layer 23, comprising nanolaminate with alternating $Al_2O_3$ and $HfO_2$ sub-layers 24, 25, lies on the glass substrate 21 and the first conductive electrode layer 22. The HfO$_2$ and Al$_2$O$_3$ sub-layers may have thicknesses as discussed above with reference to FIG. 1. The Al$_2$O$_3$ sub-layers of the nanolaminate may have a thickness in the range of 1 to 10 nm or 3 to 9 nm, for example, about 6 nm. The total thickness of the first dielectric layer may be, for example, in a range of 50 to 250 nm.

A luminescent layer 26 lies on the first dielectric layer. It may be formed, for example, of ZnS:Mn, deposited by ALD with maximum process temperature as discussed above with reference to FIG. 1, using DEZ, H$_2$S, and Mn(thd)$_3$ as precursors. Other possible Mn precursors are Mn(C$_5$H$_5$)$_2$ and its alkyl-, aryl- or carbonyl-substituted derivatives. The luminescent layer may have a thickness, for example, in a range of 400 to 1000 nm.

On the luminescent layer, there is a second dielectric layer 27 which may be substantially similar to the first dielectric layer, comprising nanolaminate with alternating Al$_2$O$_3$ and HfO$_2$ sub-layers 28, 29.

The first dielectric layer 23 has as its uppermost sub-layer, adjacent to the luminescent layer 26, an additional sub-layer 24' of aluminum oxide Al$_2$O$_3$. Correspondingly, the second dielectric layer 27 has as its lowermost sub-layer, adjacent to the luminescent layer 26, an additional sub-layer 28' of aluminum oxide Al$_2$O$_3$. Those aluminum oxide sub-layers have thicknesses higher than the aluminum oxide sub-layers of the actual nanolaminates. The thicknesses of the additional sub-layers may lie, for example, in the range of 5 to 25 nm.

On the second dielectric layer 27, i.e. on top of the structure illustrated in FIG. 2, there is a second conductive electrode layer 30 which may be substantially similar to the first conductive electrode layer 22, with the stripes 31 thereof however being directed perpendicularly to, or otherwise at an angle relative to, the conductor stripes of the first dielectric layer 22.

The EL display element may be transparent. Then, also the first and the second electrode layers may be formed of a transparent conductor material such as, for example, indium tin oxide ITO. In the case of depositing also the electrode layers by ALD, suitable materials include, for example, aluminum doped zinc oxide AZO.

The display element 20 of FIG. 2 thus has a matrix electrode configuration. In other embodiments, segmented electrode configurations may be used.

In the matrix electrode configuration, light-emitting areas in the form of pixels 32 are formed in the luminescent layer 26 at positions where the conductor stripes of the first and the second conductive electrode layers intersect.

Any appropriate further layers and/or elements may be present in an EL display element in addition to those illustrated in FIG. 2.

In any embodiment of the method and the EL display element discussed above, hafnium content of the first and/or the second dielectric layer is preferably at least 10% by mass. This refers to the mass of the hafnium contained in a dielectric layer being at least 10% of the overall mass of that layer.

In first and/or second dielectric layer where the hafnium content is at least 10% by mass, aluminum content is preferably at least 5% by mass. This refers to the mass of the aluminum contained in such dielectric layer being at least 5% of the overall mass of that layer.

The EL display element of FIG. 2 may provide various great advantages. First, as discussed above with reference to FIG. 1, the thin glass substrate serves for achieving a low overall thickness of the EL display component. This, in turn, enables having the overall EL display element as a flexible structure which may be further laminated or otherwise attached to a flexible and/or curved external substrate.

In addition, the EL display element in accordance with that of FIG. 2 has been found to have excellent stability performance. Enhanced stability results in reduced need for aging the displays in the manufacturing phase. Further, the stability of the voltage-luminance dependency may be greatly advantageous from the display element driving scheme points of view.

It will be understood that the benefits and advantages described above may relate to one embodiment or example or may relate to several embodiments or examples. The embodiments and examples are not limited to those that solve any or all of the stated problems or those that have any or all of the stated benefits and advantages. It will further be understood that reference to 'an' item refers to one or more of those items.

The term "comprising" is used in this specification to mean including the feature(s) or act(s) followed thereafter, without excluding the presence of one or more additional features or operations.

The invention claimed is:

1. An inorganic thin film electroluminescent display element having a layer structure comprising:
   a first dielectric layer;
   a luminescent layer comprising a luminescent material on the first dielectric layer; and
   a second dielectric layer on the luminescent layer,
   wherein each of the first and the second dielectric layers comprises nanolaminate with alternating aluminum oxide Al$_2$O$_3$ and hafnium oxide HfO$_2$ sub-layers, the nanolaminate having at least two sub-layers of both types,
   wherein the nanolaminate of at least one of the dielectric layers comprises at least ten HfO$_2$ sub-layers each having a thickness in a range of 0.5 to 3 nm.

2. The electroluminescent display element of claim 1, wherein the nanolaminate has a thickness of less than or equal to 300 nm.

3. The electroluminescent display element of claim 1, wherein a HfO2 sub-layer has a thickness in a range of 1 to 10 nm.

4. The electroluminescent display element of claim 1, wherein an Al$_2$O$_3$ sub-layer has a thickness in a range of 1 to 10 nm.

5. The electroluminescent display element of claim 1, wherein a hafnium content of one or both the first or the second dielectric layer is at least 10% by mass.

6. The electroluminescent display element of claim 5, wherein, in one or both the first or second dielectric layer where the hafnium content is at least 10%, an aluminum content is at least 5% by mass.

7. The electroluminescent display element of claim 1, wherein the luminescent material is manganese-doped zinc sulfide ZnS:Mn or terbium-doped zinc sulfide ZnS:Tb.

8. The electroluminescent display element of claim 1, wherein the layer structure is formed on a glass substrate having a thickness of less than or equal to 400 μm.

9. The electroluminescent display element of claim 1, wherein the display element is transparent.

10. A method for manufacturing an inorganic thin film electroluminescent display element, the method comprising forming a layer structure as defined in claim 1.

11. The method of claim 10, wherein the first and the second dielectric layers are formed by atomic layer deposition.

12. The method of claim 11, wherein the hafnium oxide sub-layers are formed using tris(dimethylamino)cyclopentadienylhafnium CpHf(NMe$_2$)$^3$ as a precursor for hafnium.

13. The method of claim 10, wherein the luminescent layer is formed by atomic layer deposition using a maximum process temperature in a range of 125 to 300° C.

* * * * *